United States Patent [19]

Lambrache

[11] Patent Number: 5,493,533
[45] Date of Patent: Feb. 20, 1996

[54] DUAL DIFFERENTIAL TRANS-IMPEDANCE SENSE AMPLIFIER AND METHOD

[75] Inventor: Emil Lambrache, San Jose, Calif.

[73] Assignee: Atmel Corporation, San Jose, Calif.

[21] Appl. No.: 313,756

[22] Filed: Sep. 28, 1994

[51] Int. Cl.⁶ ..................................................... G11C 7/02
[52] U.S. Cl. ............................................ 365/210; 365/205
[58] Field of Search ................................... 365/210, 205, 365/185, 207, 208; 327/51, 57

[56] References Cited

U.S. PATENT DOCUMENTS

| | | | |
|---|---|---|---|
| 3,676,703 | 7/1972 | Gersbach | 327/52 |
| 4,799,195 | 1/1989 | Iwahashi et al. | 365/185 |
| 4,916,665 | 4/1990 | Atsumi et al. | 365/185 |
| 5,305,273 | 4/1994 | Jinbo | 365/210 |

Primary Examiner—A. Zarabian
Attorney, Agent, or Firm—Schneck & McHugh

[57] ABSTRACT

A sense amplifier arrangement having two trans-impedance amplifiers and one precision current inverting amplifier, which receive respective first and second sense currents from core memory and a reference current from a matched reference cell. The current inverting amplifier receives the reference current and produces first and second output currents which are summed with the respective first and second sense currents for input to first and second trans-impedance amplifiers which are capable to sink or source current at their inputs as current summing nodes and are effective for producing first and second single ended voltages which are input into respective first and second comparators to produce cmos level output voltages representative of the memory states of the respective first and second memory cells. The corresponding current inverting and trans-impedance amplifiers and comparators are matched by being biased by the same source and because they have respective output voltages with swings around a selected trip point.

17 Claims, 9 Drawing Sheets

DUAL DIFFERENTIAL TRANS-IMPEDANCE SENSE AMPLIFIER AND METHOD

DESCRIPTION

1. Technical Field

The invention relates to sense amplifiers for non-volatile semiconductor memories.

2. Background Art

Non-volatile memory devices, such as electrically programmable and UV erasable read only memories (EPROMs) and electrically erasable and programmable read only memories (EEPROMs), comprise core arrays of memory cells including a variable threshold transistor. Each memory cell can include a number of transistors; at least one of them will be a variable (i.e., programmable) threshold transistor.

FIG. 1 shows a portion of a memory array 10 according to the prior art, including memory cells 11, each memory cell in turn including a pair of transistors, the first one being a select transistor 11a and the second being a variable threshold transistor 11b. According to one version of the prior art, the select transistors 11a are n-channel enhancement transistors, and the variable threshold transistors 11b are n-channel native transistors. Other kinds of memory cells 11 including a greater number of transistors are known in the prior art as well.

The memory cells 11 shown in FIG. 1 are interconnected by bit lines 12, sense lines 13, and word lines 14, as shown. In particular, the drains of the n-channel enhancement select transistors 11a will be connected to an adjacent bit line 12. The gates of select transistors 11a and variable threshold transistors 11b will respectively be connected to adjacent word lines 14 and sense lines 13.

FIG. 2 shows a non-volatile memory arrangement 15 of the prior art, including a selected portion of memory array 10 from FIG. 1. Again, memory cell 11 is shown including a pair of transistors respectively select transistor 11a and variable threshold transistor 11b. As before, according to an n-channel implementation of select and variable threshold transistors, 11a and 11b, the drain of select transistor 11a will be connected to bit line 12, and the respective gates of select and variable threshold transistors, 11a and 11b, will be connected respectively to word and sense lines, 14 and 13. Word line 14 is driven by a word line decoder 16.

Additionally shown in prior art, FIG. 2 is read select transistor 17 which is connected to read select line 17'. When read operation is active, read select transistor 17 is turned on, electrically connecting bit line 12 to a data bus 18 which is connected to a sense amplifier 19.

According to the prior art, when the circuitry of FIG. 2 is subject to read operation, the conductive state of memory cell 11 is queried by connecting bit line 12 to sense amplifier 19 and by applying appropriate bias voltages to the selected bit, sense, and word lines 12, 13, and 14. If cell select transistor 11a is turned on and the bias voltage applied to the sense line 13 exceeds the threshold of the variable threshold transistor 11b, then current will flow from bit line 12 to ground through cell 11 and sense amplifier 19 will detect a "low" state, according to convention. Conversely, if the bias voltage applied to sense line 13 does not exceed the threshold of variable threshold transistor 11b, then no current will flow through cell 11, and sense amplifier 32 will detect a "high" state.

While this core sensing approach of the prior art provides an operable memory arrangement which is widely used, the power consumption levels which characterize this approach are disadvantageous.

Further, in memory cores employing conventional sense amplifiers, power consumption may vary considerably with variations in power supply voltages. Additionally, conventional sense amplifier schemes may employ inverters as error amplifiers in closed loops. Such inverters tend to display a steep increase in bias current with supply voltage increases when kept near their trip point by the feedback loop.

The bias currents provided in prior art inverters employed in sense amplifier arrangements are typically temperature uncompensated, causing substantial variations in the bias currents with variations in temperature. Additionally, typical sense amplifiers are connected to a "sense node," which in the usual case is a relatively high electrical impedance connection point.

SUMMARY OF THE INVENTION

According to the invention herein, a sense amplifier arrangement includes a current inverting amplifier and a trans-impedance amplifier for respectively receiving a reference current and a difference current based upon the reference current and a sense current from a selected memory cell. The difference current is provided by the input node of the trans-impedance amplifier being connected to the output of the current inverting amplifier and to a bit line connected to the selected memory cell. Further according to the invention, the sense amplifier arrangement of the invention may share the current inverting amplifier and with an additional trans-impedance amplifier for receiving an additional core sense current from a different core memory location. The second and additional trans-impedance amplifiers drive individual comparators for producing respective output voltage signals indicative of the memory states of selected first and second core memory locations.

Thus, the combination of a dual-output current inverting amplifier with two trans-impedance amplifiers provide in the inventive arrangement the function set out in the title of this invention, namely "Dual (2 bit lines) Differential (each cell current is compared against the reference current) Trans-impedance (the circuit reads currents and delivers voltages) Sense Amplifier".

The architecture of the present invention allows the level of power consumption in the core memory in non-volatile semiconductor memory arrays to be reduced. Power consumption is reduced, in part because reference bit lines between adjacent memory columns are shared. Thus, reference current induced power consumption is reduced by 50%. Further, the current consumption is made independent of supply voltage variations. According to the invention, the current inverting, transimpedance and comparator amplifiers of the sense amplifier arrangement are driven by the same bias signals and copy the temperature compensated bias current generated inside the bias circuit. As noted, this results in comprehensive temperature regulation for the overall sense amplifier arrangement of the invention. The current inverting and trans-impedance amplifiers used respectively as reference and sense inputs can both source and sink current. As noted, the amplifiers and comparators employed with the inventive arrangement share the same bias signal PBIAS, permitting trip point matching between amplifiers and comparators. The output voltage from the following comparator is accordingly centered about the trip point. The trans-impedance amplifiers of the inventive arrangement are designed to have a resistive path from the output node to the input node. Accordingly, output node impedance is reduced both during high and low memory states. In the case of the low memory state, i.e. the cell is sinking current from the input node of the trans-impedance amplifier, a ratioed pair of nmos enhancement transistors, termed NpushA and NpushB, connected with the diode part between the pmos bias current delivering transistor and the input node and the copying part connected between the power supply and the input node, multiplies the capability of the input node of the trans-impedance amplifier to source current with the ratio of the nmos pair, thus saving bias current and also reducing the size of the pmos bias transistor.

Further according to the invention, for the high memory state, when the reference current overcomes the cell current, a zero voltage threshold native nmos transistor Wpull is connected as a diode and is thereby capable of sinking current at the input node of each trans-impedance amplifier of the inventive arrangement, with the result of an output voltage swing being established in the magnitude of the sum of one enhancement threshold voltage level plus one native threshold voltage level, i.e., approximately IV peak to peak. The effect of this limited voltage swing at the output of the comparators employed in connection with the inventive arrangement is to improve memory sensing speed.

The output voltage swing is additionally guaranteed to be at least 0.7 volts in magnitude, because of the enhancement threshold of the enhancement transistors connected within each trans-impedance amplifier, at even very small input currents. Additionally, a feedback path is established in the current inverting and both trans-impedance amplifiers, by transistors NpushA and NpushB, in the high state, and native transistor Wpull in the low state, which provides a non-linear response, according to which when the output voltage swings between high and low, the feedback loop is open. Under this condition, the voltage gain of the nmos gain transistor in each current differencing amplifier which operates on the output impedance of the pmos bias transistor (a pmos device sourcing Ibias) is maximal. This voltage gain accordingly provides a maximal current to charge or discharge the capacitance of the outnode of each current inverting or trans-impedance amplifier. Concomitantly, at a high or low final state of each trans-impedance amplifier output, the non-linear feedback becomes low-resistive preventing ringing on the output node of the arrangement of the invention.

BEST MODE FOR CARRYING OUT THE INVENTION

Figure 1:
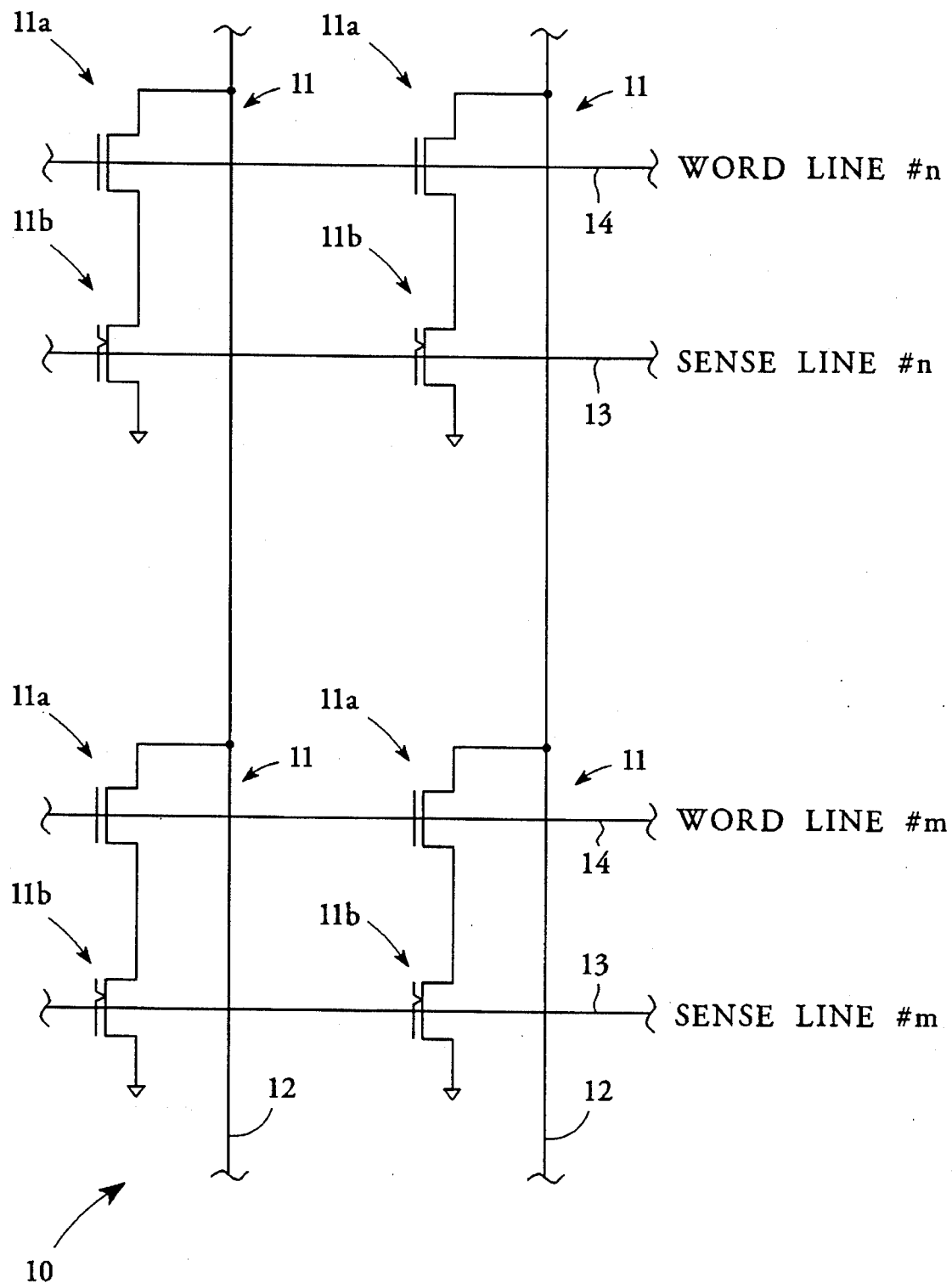
FIG. 1 shows a non-volatile semiconductor memory core arrangement according to the prior art.
Figure 2:
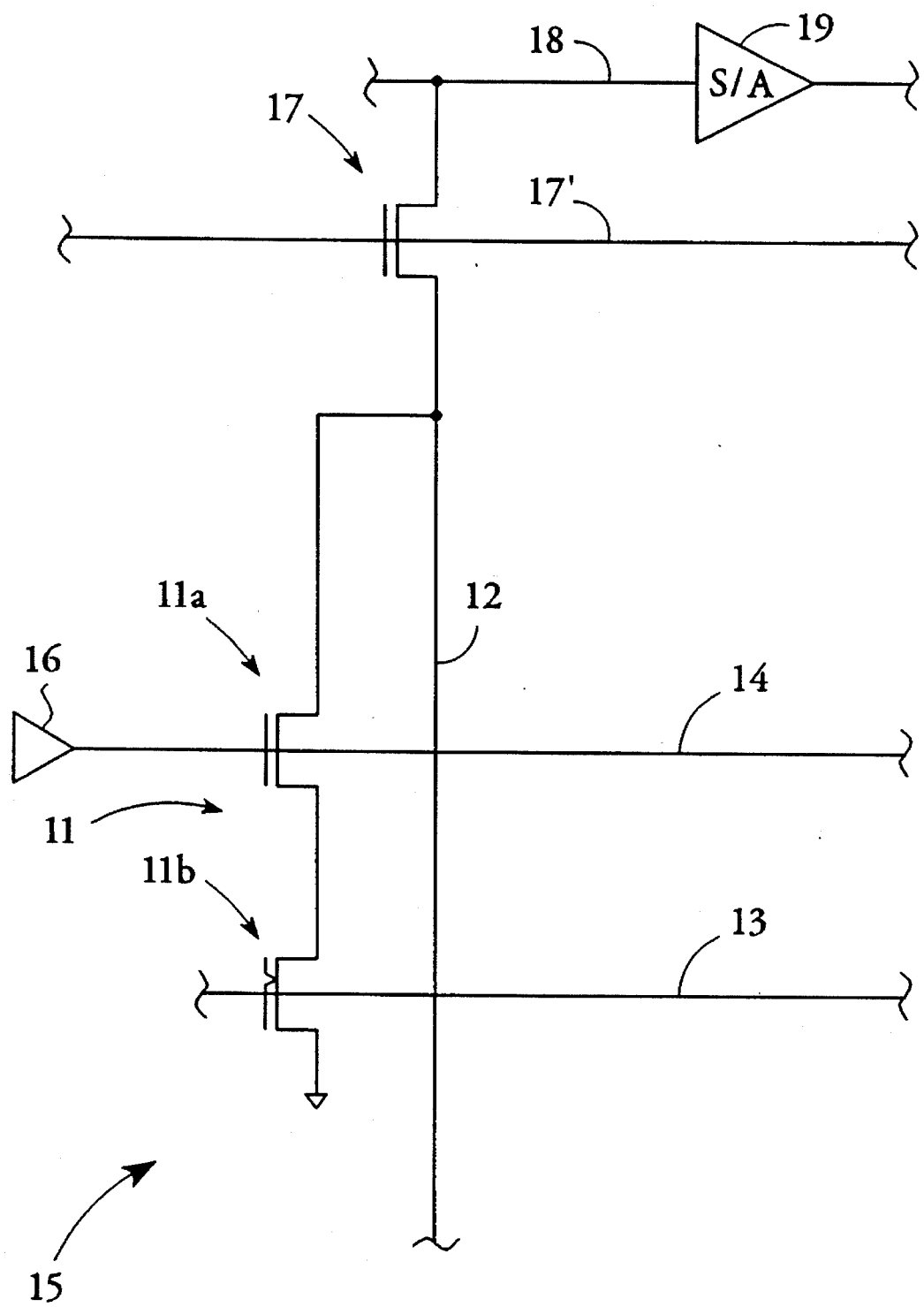
FIG. 2 shows a non-volatile semiconductor memory arrangement according to the prior art, which includes a conventional sense amplifier arrangement.
Figure 3:
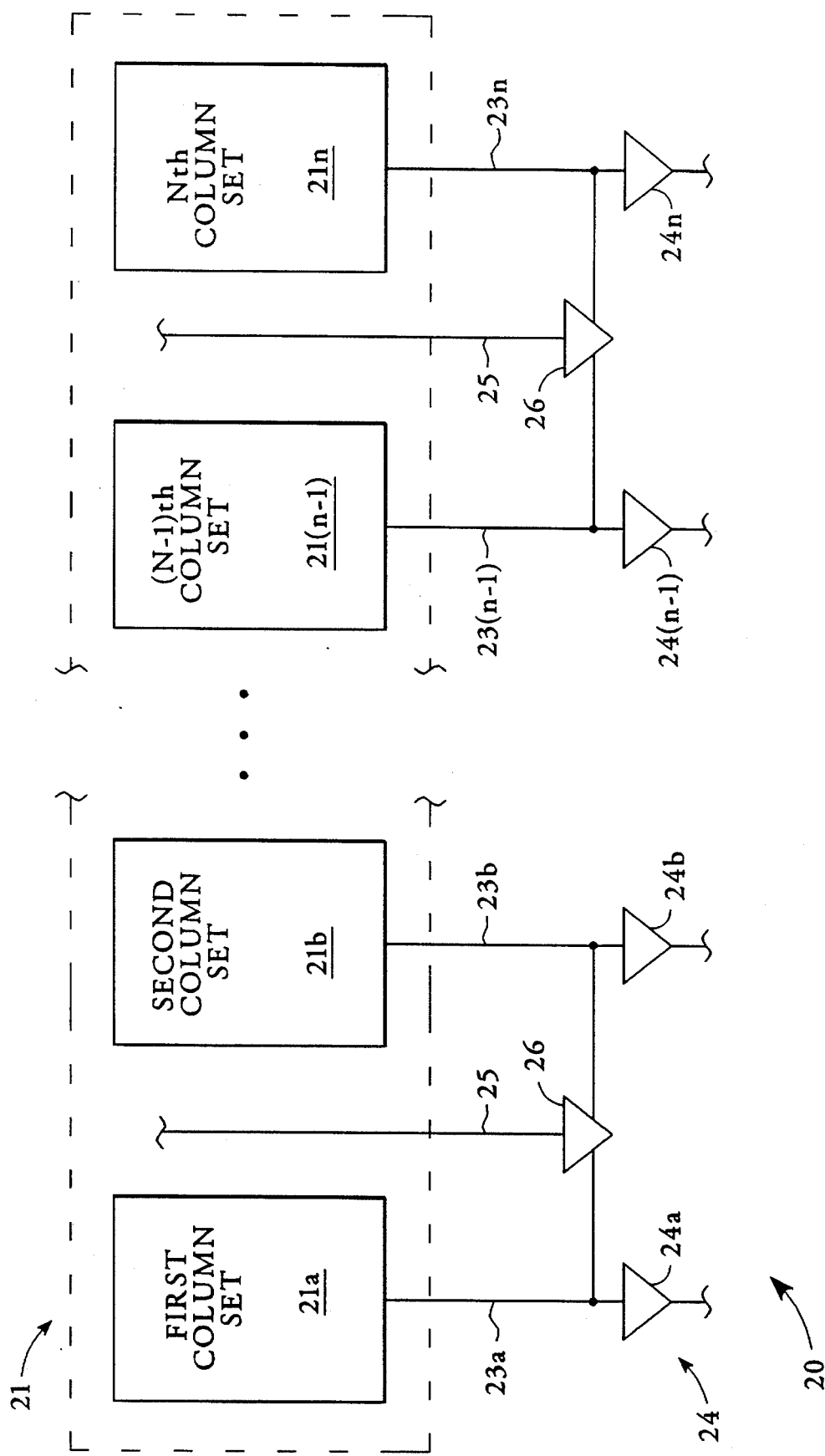
FIG. 3 shows a schematic illustrating an improved memory core arrangement of the present invention, which includes interspersed reference columns distributed within the core.
Figure 10:
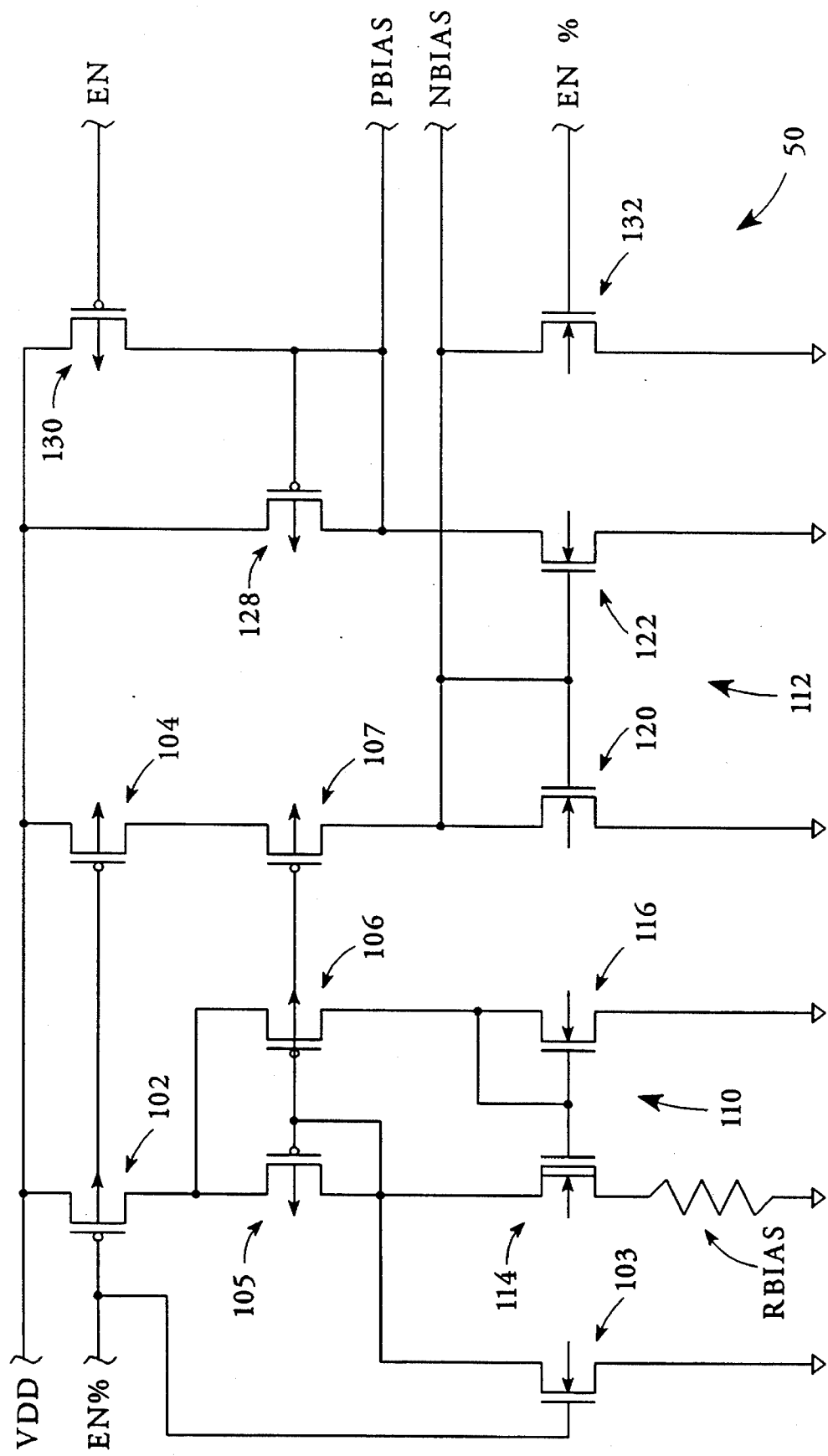
FIG. 10 illustrates the arrangement of the bias circuit shown in FIG. 4.

With reference to FIG. 3, a semiconductor memory and sense amplifier arrangement 20 includes a memory core 21 and a sense circuit arrangement 23 which includes trans-impedance sense amplifiers 24, 24a and 24b, 24e and reference current amplifiers 26, each of them set to the same trip point voltage, Vtp, and provided with the same enable, complementary enable and bias signals, respectively EN, EN%, PBIAS, and NBIAS. The bias signals, as will be discussed in detail below in connection with FIG. 10, are provided by a bias circuit 50, seen in FIG. 4, which provides respective positive and negative bias signals PBIAS and NBIAS, along respective bias lines 52 and 54. The memory core 21 includes for example 2048 active (and additionally 32 redundant) memory core columns each associated with a predetermined number of core cells including a select transistor and a floating gate transistor, as noted above.

Returning to FIG. 3, the memory core 21 of semiconductor memory and sense arrangement 20 is organized with a plurality of core column sets, 21a through 21n and trans-impedance amplifiers 24a, 24b, ... 24n. Each core column set 21a... 21n is supplying all its bit lines into a select circuit, which in turn delivers one core block output line, called herein as "OD line", labeled 23a to 23n. Each OD line is connected to a corresponding one of trans-impedance amplifiers 24a... 24n of sense amplifier 24. Interspersed between the respective column sets 21a... 21n are reference columns 25 which provide respective sources of reference currents indicative of reference conditions local to the respective reference columns 25. Each reference column is connected to a corresponding reference current inverting amplifier 26. Each reference current inverting amplifier 26 includes first and second outputs which are respectively connected to adjacent OD lines of trans-impedance amplifiers 24a... 24n at respective output thereof.

In one embodiment of semiconductor memory core 21, each column set, 21a... 21n, includes 128 active and additionally two redundant memory core columns. A result of this interspersed distribution of reference columns 25 within memory core 21, is the establishment of automatic matching of core cell parameters and reference cell parameters over the entire effective voltage and temperature range. Each row of memory core cells is programmed at a particular voltage and temperature. Accordingly, the reference cell which shares the same word line of the applicable reference column is automatically programmed to match the conditions of the corresponding memory core cell at the particular row within memory core 21.

Figure 4:
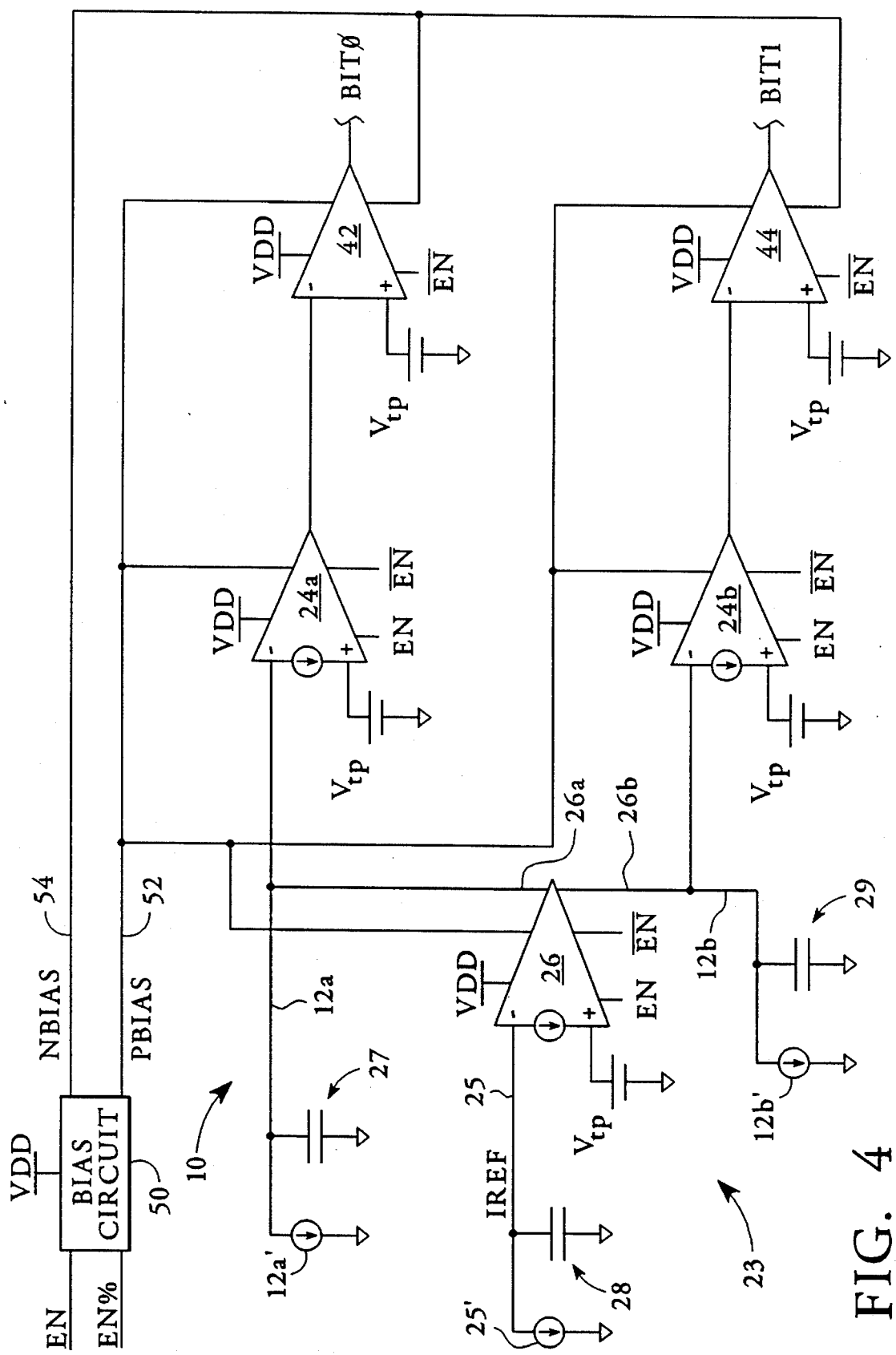
FIG. 4 is a block diagram of a sense amplifier arrangement according to the invention herein.

FIG. 4 is a block diagram of sense amplifier arrangement 23 according to the invention herein, including bias circuit 50 as will be discussed in greater detail below. In particular, according to the invention herein, sense amplifier arrangement 23 includes first and second amplifiers respectively 26 and 24a for receiving the reference current, indicated in FIG.

4 as current source 25', and a difference of a selected core sense current, indicated in FIG. 4 as current source 12'a, and the inverted reference current, indicated in FIG. 4 as current 26a which is the output current of first amplifier 26. The first amplifier 26 is a precision current inverting amplifier which sources in its output node exactly 50% of the current being sunk from its input node by the reference cell. The second amplifier 24a thus receives at its input node 12a the difference between the core cell current 12a and 50% of reference current 25. This arrangement has a summing node, namely node 12a, where the current difference occurs. An additional sense amplifier arrangement shares the first amplifier 26 and includes its own additional amplifier 24b for receiving an additional core sense current, represented as current source 12b' from the adjacent column set.

Each of current sources 12a', 12b', and 25' in FIG. 4 is accompanied by a corresponding core capacitance, represented in FIG. 4 by respective capacitors 27, 28 and 29. The second and additional trans-impedance amplifiers, respectively 24a and 24b drive individual comparators, respectively 42 and 44 for producing respective output voltage signals indicative of the memory states of selected first and second core memory locations. Bias circuit 50 provides respective positive and negative bias signals, PBIAS and NBIAS, along respective bias lines 52 and 54, as shown in FIG. 4. Bias circuit 50 is provided with power from a voltage source, VDD. Control of bias circuit 50 is accomplished by exercising enable and complementary enable signals, respectively EN and EN %. NBIAS signals are provided to comparators 42 and 44; PBIAS signals are provided to comparators 42 and 44, and additionally to each of amplifiers 24a, 24b, and 26. Comparators 42 and 44 are provided with complementary enable signals EN %; trans-impedance amplifiers 24a, 24b, and current inverting amplifier 26 are provided with complementary enable signals EN % and with the enable signals EN as well. The + inputs on FIG. 4 into amplifiers 26, 24a, 24b and comparators 42 and 44 are VIRTUAL, not real, in the sense that because of the common bias signal PBIAS, all circuits SHARE the same trip voltage, namely Vtp, so that all OD lines, i.e. 12a and 12b, as well as reference columns 25, will be set at Vtp by the respective amplifiers which act as virtual voltage sources on their inputs.

The outputs of respective comparators 42 and 44 in FIG. 4 are respective voltage outputs for BIT0 and BIT1. The output current from current amplifier 25 is as mentioned before one half of the reference current IR. Accordingly, the current input to trans-impedance amplifiers 24a and 24b is respectively ID0-IR/2 and ID1-IR/2. Accordingly, depending on the current conditions of ID0 and ID1, the current into amplifiers 24a and 24b is either IR/2 or −IR/2. As such, these trans-impedance amplifiers are subject to a push-pull current effect. As current differencing amplifiers, they are essentially connected as virtual ground, and capable of both sinking and sourcing current. Ordinarily, according to the prior art, sense amplifiers can only source currents at their input or sense nodes. The absence of such a sense node and the presence of the indicated current differencing into a virtual ground node makes possible trip point matching between the trans-impedance amplifiers and the following comparators 42 and 44. This matching is enabled by the shared bias signal PBIAS. Because of the push-pull current capability of the trans-impedance amplifiers, it is additionally possible to achieve differential current to single ended voltage conversion centered around the trip points of comparators 42 and 44.

Figure 5:
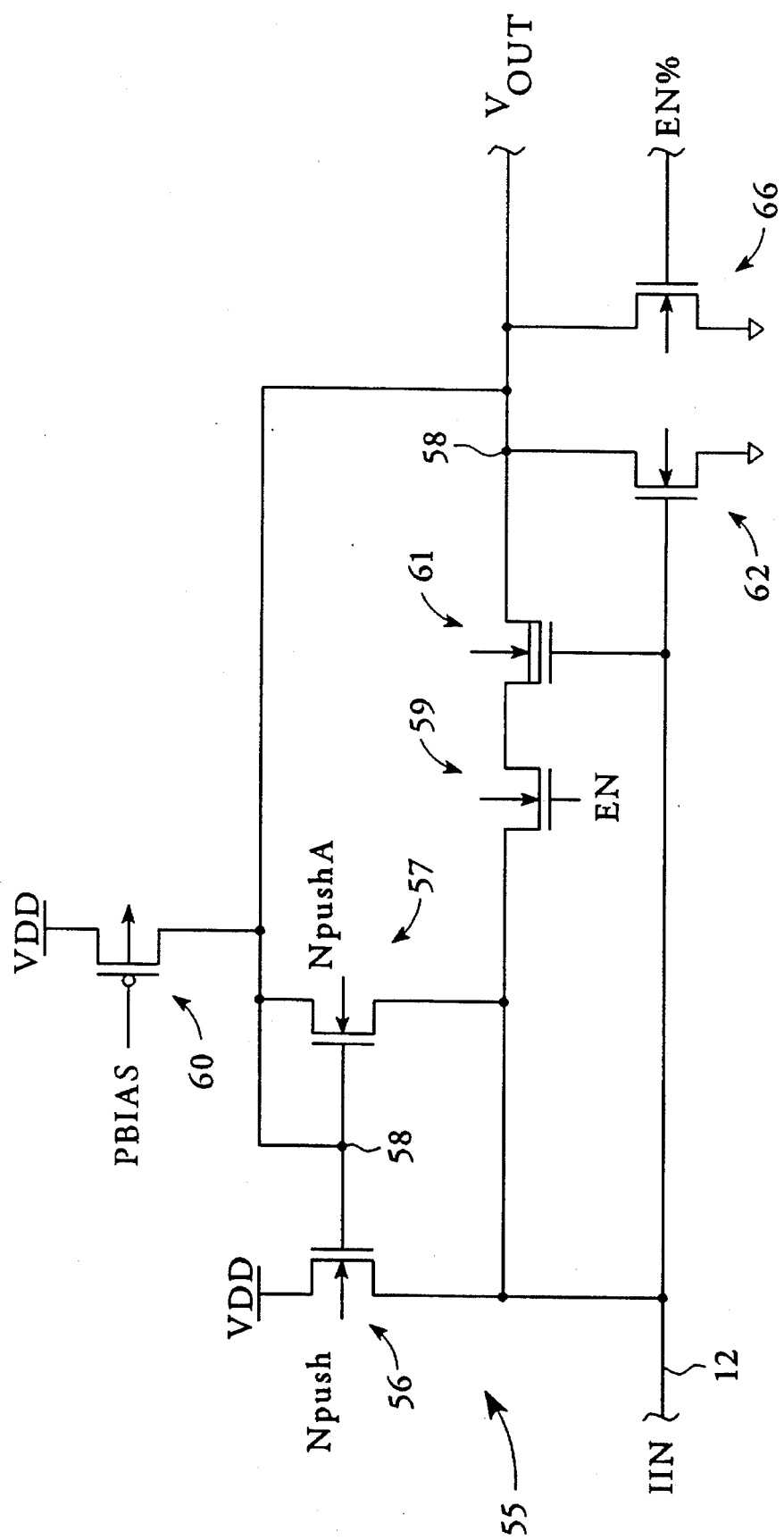
FIG. 5 is an electric circuit diagram of an amplifier arrangement of the invention herein, illustrating the push-pull features of its operation.

FIG. 5 is a circuit diagram of a single trans-impedance amplifier 24a of the sense amplifier arrangement 24 of the invention herein, illustrating the push-pull features of its operation. In particular, FIG. 5 shows common features of trans-impedance amplifiers 24a and 24b. In particular, a trans-impedance amplifier according to the invention comprises a push-pull sense amplifier arrangement. Current sourcing into the OD line 12 is implemented by a current mirror arrangement 55, including first and second transistors 56 and 57 which are connected to each other at a common node 58, which is the output of the amplifier. The common node 58 is connected to the respective gates of first and second transistors 56 and 57 (i.e., respectively Npush and NpushA) and to the drain of the second transistor 57. The sources of 56 and 57 are connected to the OD line 12, thus being able to source current into it. The second transistor 57 is provided with current from the supply voltage source through transistor 60 which is controlled by a signal line providing the bias signal PBIAS. Current sinking from the input OD line 12 is enabled by native n-channel transistor 61, which is diode-connected with the gate side to the input OD line 12 through enable transistor 59 and with the source side to the pull-down transistor 62. The pull-down transistor 62 is connected with the gate to the input OD line 12, the drain to the output node 58 and the source to ground, acting as the gain stage of the amplifier. Complementary enable transistor 66 is connected to the output in order to enable selective grounding of the output line. If the input to the trans-impedance amplifier 24a, 24b is in a LOW state (i.e. the core cell is sinking current), the sourcing current capability of the trans-impedance amplifier 24a, or 24b, is amplified by the mirror ratio of channel widths of respective first and second mirror transistors 56 and 57. This provides a controlled maximum charging current capability at cold temperatures which is effective for keeping power supply originating noise under control during sensing operation. This is accomplished because of reduced bit line capacitive current spikes under temperature compensated operation. At high temperatures, this mirroring pair 56 and 57 still provides a fast charge up of the OD and bit lines by pushing from the power supply a multiple of the bias current into the capacitances 27, 28 or 29. Second transistor 57, together with native transistor 61, provide a resistive path from the output of the trans-impedance amplifier 24a or 24b to the low impedance input OD line 12a or 12b, thus avoiding a high impedance condition at the output during respectively low or high input states. This improves feedback stability and prevents output ringing. Second transistor 57 is further effective for providing compensation for frequency response. Additionally, at the trip point, second transistor 57 does not require extra bias current, as it is driven only in the output high state by a fraction of the input current. In the output low state, the input current sinking capability does not need to be multiplied, because the maximum positive input current at the input node is only IR/2, which is much smaller than the bit line capacitive charging current spike.

In summary, the mirror arrangement 55 employs enhancement nmos transistors to push current from the power supply, under the control of the bias transistor 60, into the OD line 12 (i.e., gate coupled transistors 56 and 57), and a native nmos transistor 61 is employed to pull current from OD input line 12 into the pull-down gain transistor 62, connected with its gate at the input OD line and its drain to the output node 58. As a result, the output voltage swing at Vout is approximately the sum of one enhancement threshold plus one native threshold, or approximately one volt. Accordingly, the output voltage swing is clamped to less than approximately one volt, establishing a considerable speed improvement over the prior art which for example employs a pair of anti-parallel diodes. Further, the voltage swing at the output is further guaranteed to be at least 0.7 volts, because of the enhancement threshold at even very small input currents. This ensures a favorable noise margin. Additionally, feedback is provided by the current mirror 56 in output high states and by native transistor 61 in output low states, such that when the output voltage swings between high and low levels, the feedback loop will be open. Accordingly, the voltage gain of nmos enhancement transistor 62 working on the output impedance of transistor 60 (pmos transistor) is maximal, providing the maximal current to charge or discharge the capacitance of the output node. When reaching the output high or low final state, this non-linear feedback becomes a low resistance feedback, effectively preventing output ringing effects. The transistors in the trans-impedance amplifier 24 of sense amplifier arrangement 23 shown in FIG. 5 are primarily n-channel enhancement transistors except for n-channel native transistor 61 and p-channel enhancement transistor 60.

Figure 7:
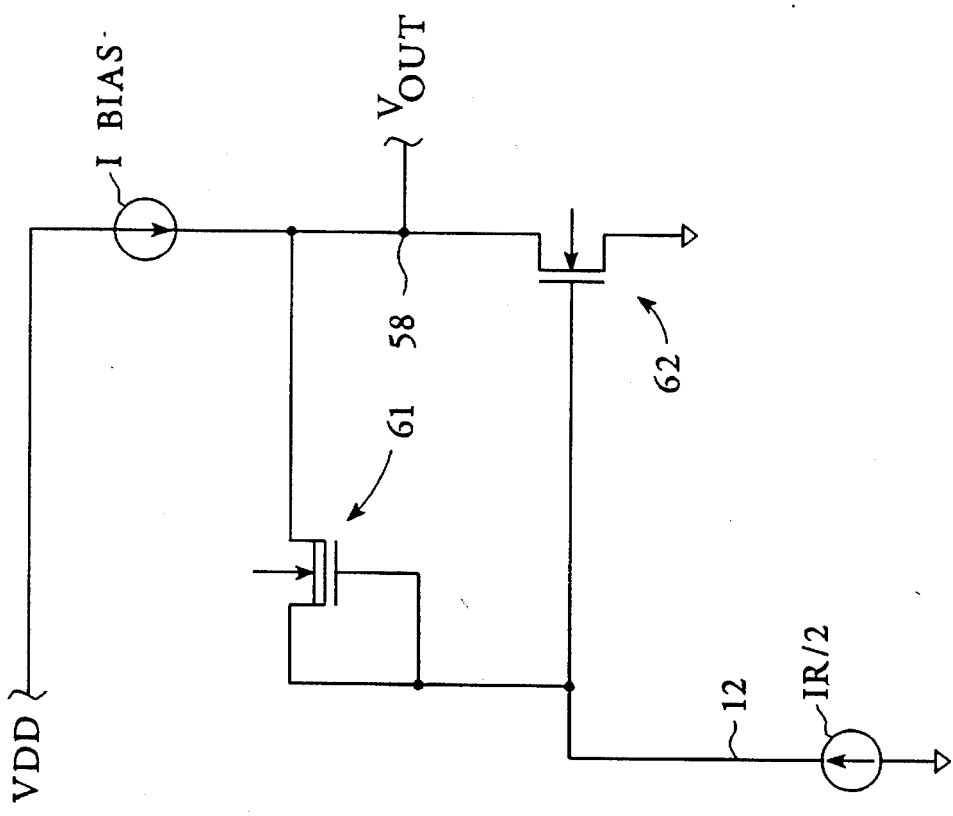
FIG. 7 is a diagram of the circuit shown in FIG. 5 in an input high, output low state.
Figure 6:
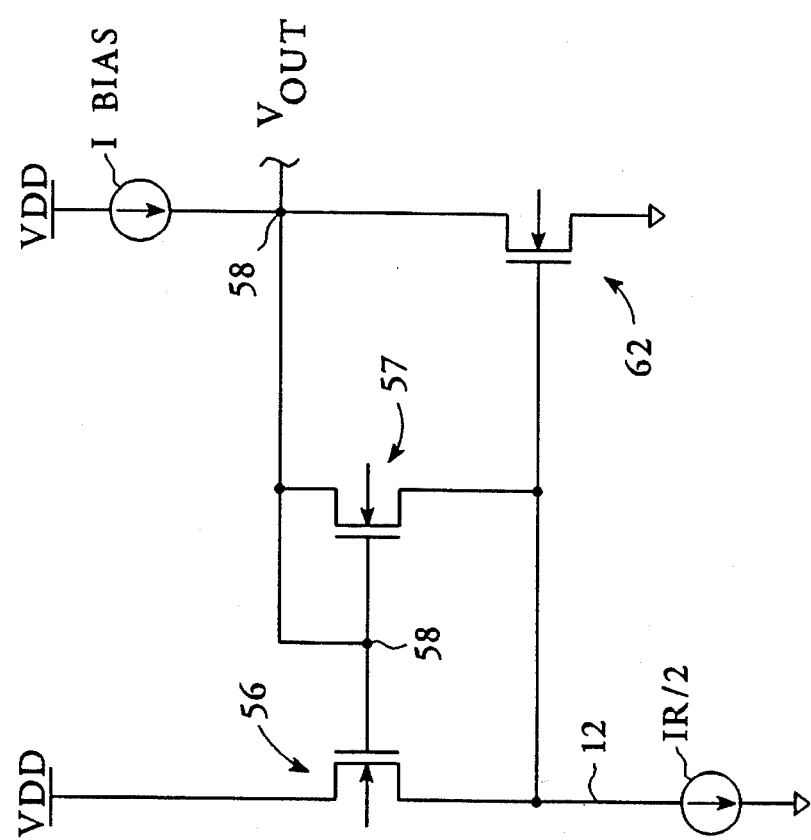
FIG. 6 is a diagram of the circuit shown in FIG. 5 in an input low, output high state.

FIG. 6 is an equivalent diagram of the circuit of trans-impedance amplifier 24a shown in FIG. 5 in which the signal received from a sensed memory cell along OD line 12 is in a LOW state. In particular, in a cell LOW state, the input current difference IR/2 is effective for producing a relatively small change in the bias current through transistor 62 in the amount of IR/(m+1), where m is the ratio of 56 versus 57. The currents through the respective branches of current mirror 55, respectively first and second transistors 56 and 57, are respectively m/(m+1)IR/2 and 1/(m+1)IR/2. In this way, the input voltage swing at the OD line, given by the variation in the bias current of gain transistor 62, is reduced almost m times, dividing by m the transitory time to achieve the dc final state on the large input capacitances 27, 28 or 29. Effectively, the current mirror 56 and 57 with a ratio of m makes the sense amp m times faster when sensing a LOW state. Additionally, FIG. 7 is an equivalent diagram of the circuit shown in FIG. 5 in an input 0D line HIGH state. In this case, the output current through transistor 62 is Ibias +IR/2, i.e. the input swing is not divided by any factor, but always a HIGH state shows up on the OD line almost instantaneously, while a LOW state includes core word line delays. Further shown in FIG. 7 is a direct current path for the upward directed input current IR/2 through native transistor 61 towards the pull-down transistor 62.

Figure 8:
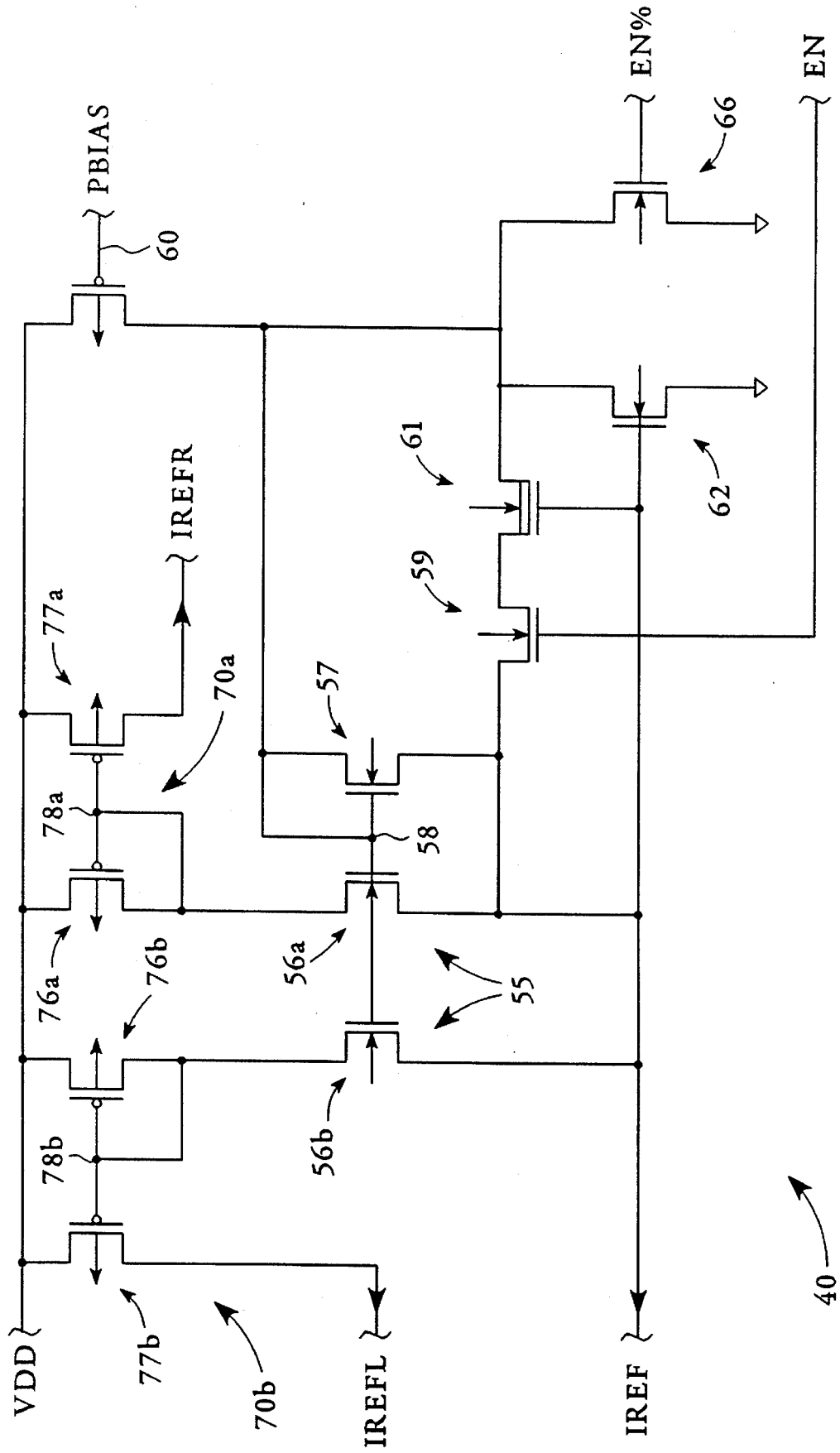
FIG. 8 is a circuit diagram of the reference amplifier set forth in the block diagram of FIG. 4.

FIG. 8 shows the circuit diagram of the reference current amplifier 26 according to the invention herein. Many of the circuit elements and connections shown for reference current 26 are the same as those for the trans-impedance amplifier 24 of FIG. 5 above. In particular, reference current amplifier 26 according to the invention includes a push-pull sense amplifier arrangement including current mirror arrangement 55, as included in current differencing amplifier 24. Current mirror arrangement 55 further includes first and second transistors 56a and 57 which are connected to each other at a common node 58 at their respective gates and further to the drain of the second transistor 57. Their sources are both connected to the input reference column 25. Additionally, the current mirror arrangement includes an additional transistor 56b which is connected at its gate to common node 58. The second transistor 57 is provided with current from the supply voltage source (5 v) through transistor 60 which is controlled by a signal line providing the bias signal PBIAS. Current sinking from the input bit line is enabled by native n-channel transistor 61 to enable the overshot clamping after the charge-up of the reference column. The reference input IREF is always in a LOW state. The sourcing current capability is amplified by the mirror ratio of channel widths of respective mirror transistors 56a, 56b and 57. This provides first and second currents which drive respective first and second pmos current mirror circuits 70a and 70b, which are connected to the sources of respective transistors 56a and 56b. Current mirror circuit 70a includes first and second mirror transistors 76a and 77a which are connected at their respective gates to a common node 78a. Additionally, pmos current mirror circuit 70b includes first and second mirror transistors 76b and 77b which are connected at their respective gates to a common node 78b. Respective common nodes 78a and 78b are connected to the drains of transistors 56a and 56b. The sources of respective transistors 76a, 76b, 77a, and 77b are connected to voltage source VDD. According to the current mirroring effect provided by respective current mirror circuits 70a and 70b, the drains of respective transistors 77a and 77b deliver respective output reference currents of a magnitude of IR/2. A first of these outputs is labeled IREFL and a second of these outputs is labeled IREFR. The precision of copying at 50% and inverting the output current versus the input current is achieved by the matching of the circuitry between amplifiers 24 and 26, which are almost identical, except the point where their output is taken.

Figure 9:
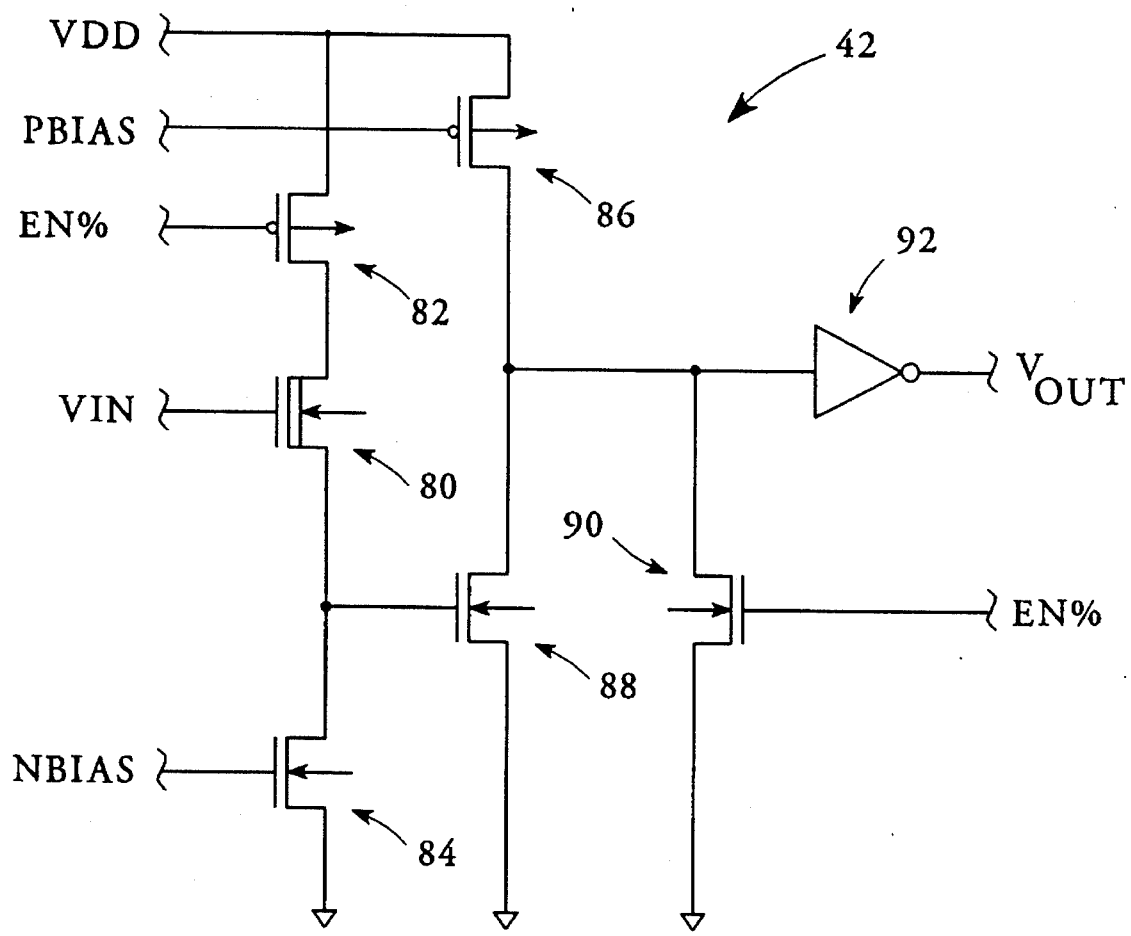
FIG. 9 shows the circuit diagram of a comparator element employed in the sense amplifier arrangement shown in FIG. 4.

FIG. 9 shows the circuit diagram of a comparator element such as comparators 42 and 44 employed according to the invention in the sense amplifier arrangement 23 shown in FIG. 4. In particular, each of comparators 42 includes input native transistor 80, complementary enable pmos transistor 82, and bias transistors 84 and 86. Input native transistor 80 is connected at its drain to enable transistor 82, and at its source to bias transistor 84. The source of enable transistor 82 is connected to the supply voltage VDD. The source of bias transistor 84 is connected to ground. The gate of enable transistor 82 is driven by an enable signal EN %; the gate of bias transistor 84 is connected to the signal NBIAS. Each of comparators 42 and 44 further includes an output transistor 88. The drain of bias transistor 84 and the source of native transistor 80 are connected to each other and to the gate of output transistor 88 which in turn is connected at its drain to bias pmos transistor 86. The drain of output transistor 88 is further connected to the drain of a complementary enable transistor 90 and to the input of an output inverter 92. The source of bias pmos transistor 86 is connected to the voltage supply VDD. The gate of bias transistor 86 is driven by a bias signal PBIAS. The comparator 42 indicated is intended generally to be the same in terms of its characteristics as its companion comparator 44. The two comparators 42 and 44 are considered to be matched comparators, in consideration of the trip point, i.e., Vtp, of each of comparators 42 and 44 being effective for tracking the sense amplifier trip point over temperature and supply voltage variations. This trip point is considered to be the voltage point at which the trans-impedance amplifiers 24a and 24b, as well as the current amplifier 26 tend to settle respectively OD lines 12a and 12b and reference column 25. The input impedance of a well-matched comparator is necessarily very large. To ensure this, the input transistor 80 is connected as a source follower, effective for buffering the comparator 42 input. This arrangement is effective for providing a useful level shift, to adjust the sense amplifier output voltage swing range around the trip point of output transistor 88.

FIG. 10 illustrates the arrangement of the bias circuit 50 shown in FIG. 4. In particular, bias circuit 50 includes supply voltage (VDD), enable (EN), and complementary enable (EN %) inputs; additionally, bias circuit 50 includes first and second bias outputs, respectively PBIAS and NBIAS, which refers to their status as pmos and nmos bias signals. The indicated bias circuit 50 is effective for generating temperature compensated bias currents. Bias circuit 50 includes a pmos start transistor 102, and additionally a nmos start transistor 103. Each of transistors 102 and 103 is connected at its respective gate to receive complementary enable signal EN %. Bias circuit 50 additionally includes pmos transistor 104, which is connected at its gate to receive input signal EN %. Transistor 104 is further connected at its source to the voltage source VDD.

When EN % makes a high to low transition, the scheme of bias circuit 50 is enabled for operation. At this time, start transistors 102 and 103 are in an inverter configuration. As such, they provide at their respective trip point a current pulse which flows through the pmos diode-connected transistor 105. This is effective for firing up the positive feedback, but it does not last longer than the fall time of EN%. Bias circuit 50 additionally includes a mirror arrangement of pmos transistors respectively 105, 106 and 107. Pmos transistors 105, 106, 107 are connected to each other at their respective gates. The gate of pmos transistor 105 is connected to its drain. The source of pmos transistor 106 is connected to the source of pmos transistor 105, and together to the drain of pmos transistor 102, while the gate and drain of transistor 105 is connected to the drain of transistor 103, thus providing the inverter configuration of transistor 102 and 103 with the pmos diode-connected 105 inserted in series in between them. The source of pmos transistor 107 is connected to the drain of pmos transistor 104.

Bias circuit 50 additionally includes first and second nmos mirror circuits 110 and 112 for copying and multiplying the bias current. First nmos mirror circuit 110 includes first and second transistors, respectively a native nmos transistor 114 and a nmos enhancement transistor 116. Additionally, current mirror circuit 110 includes a resistor 118, referred to as "RBIAS," which is connected to the source of native nmos transistor 114. Native nmos transistor 114 and nmos enhancement transistor 116 are connected at their respective gates, and the gate of transistor 116 is connected to its drain. Transistor 114 is a native transistor and as such, it has a zero volt threshold; transistor 116 is an n-channel enhancement transistor, with a threshold of about 0.7 V. Second mirror circuit 112 includes first and second transistors, respectively nmos enhancement transistors 120 and 122. Transistors 120 and 122 are connected at their respective gates, and the drain of transistor 120 is connected to its gate and also to the drain of transistor 107, from which it receives the bias current. This two stage mirror approach is effective for separating the heavy capacitive load on the PBIAS node, which is shared throughout the arrangement of this invention. This results in an improvement of the gain margin of the positive feedback loop to approximately −20dB, and additionally has the effect of reducing significantly the settling time of the bias current. The bias circuit 50 relies for its effectiveness upon the use of an enhancement and native transistor in a gate coupled pair in order to establish first mirror circuit 110. According to a preferred version of the invention, native nmos transistor 114 and enhancement nmos transistor 116 are ratioed 2:1. As a result, the gate to source voltages of transistors 114 and 116 cancel, with the result that the difference in threshold voltages equals the bias voltage of the resistor RBIAS, such as its resistance, RBIAS, times the drain-source current Ids through native transistor 114 equals this temperature compensated threshold voltage difference. Accordingly, by selecting RBIAS to be a low temperature coefficient resistor, the temperature independence of the drain source current Ids through transistor 114 is assured. Bias circuit 50 additionally includes enable transistor 130 and complementary enable transistor 132. Bias circuit 50 also includes a diodeconnected pmos device, transistor 128, intended as the diode in a multi-mirror arrangement over the entire schematic 23, with PBIAS as its gate-drain node. Transistor 128 is connected at its source to the voltage supply VDD and at its drain and gate to PBIAS; enable transistor 130 is connected at its source to the voltage supply as well and at its drain to PBIAS. The gate of enable transistor 130 is driven by the enable signal EN, and the gate of enable transistor 128 is connected to PBIAS. Complementary enable transistor 132 is connected at its drain to NBIAS and at its source to the complementary enable signal EN %.

In summary, according to the arrangement of the invention, sense amplifier speed has been improved by maintaining four quadrant low impedance on the core block output line. Additionally, memory speed has been improved by reducing comparator input node capacitance through the use of follower buffering circuitry. Further, the circuit arrangement of the invention effectively controls output voltage swing by providing active clamping circuitry which does not draw extra bias current in either HIGH or LOW state.

I claim:

1. A sense amplifier circuit connected to a semiconductor memory including a plurality of memory core cells and reference cells interspersed therewith, and bit lines connected to said memory core cells and reference cells, said sense amplifier circuit comprising:

(a) current inverting means for receiving a reference current at a reference input node from a selected reference cell in said semiconductor memory, said current inverting means producing a first electric current based upon said reference current, but flowing in an opposite direction;

(b) trans-impedance means for receiving a second electric current at a core current summation input node from a first selected core memory cell indicative of its memory state also for receiving at the same current summation input node said first electric current from said current inverting means, and effective for producing a voltage output signal responsive to a difference of said first electric current and said second electric current, each of said current inverting means and trans-impedance means including push means for sourcing current out of said current inverting means and trans-impedance means and pull means for sinking current into said current inverting means and trans-impedance means; and (c) a bias generator for producing a control voltage insensitive to power supply and temperature variations, said control voltage being coupled to control an operational speed of said current inverting means and trans-impedance means.

2. The sense amplifier circuit according to claim 1, wherein said pull means includes a native nmos transistor.

3. The sense amplifier circuit according to claim 1, wherein said push means includes a mirror of enhancement nmos transistors.

4. The sense amplifier circuit according to claim 1, further comprising comparator means for receiving said voltage output signal from said trans-impedance means, said comparator means being effective for producing comparator output signals responsive to said trans-impedance means.

5. The sense amplifier circuit according to claim 1, wherein each said current inverting and trans-impedance means includes push-pull virtual ground input nodes.

6. The sense amplifier circuit according to claim 1, wherein said bias generator produces two control voltages, one control voltage having a low positive value and another control voltage having a high positive value, both of said control voltages being provided to both said current inverting and trans-impedance means.

7. The sense amplifier circuit according to claim 1, wherein each said current inverting means and trans-impedance means incorporates a clamping diode between an input node and an internal source of current said input node being further tied to a gate of a MOS transistor and said internal source of current being tied to an electrode of said MOS transistor so as to make a closed loop, said closed loop creating a feedback condition for AC current whereby current ringing in said closed loop is prevented.

8. The sense amplifier circuit according to claim 7, wherein each said current inverting and trans-impedance means includes a native nmos transistor effective for sinking the current delivered into its input node.

9. The sense amplifier circuit according to claim 7, wherein each said inverting and trans-impedance means includes a mirror of enhancement nmos transistors to push current at its input node.

10. A sense amplifier circuit connected to a semiconductor memory, comprising:
  (a) current inverting means for receiving a reference current from a reference column in said semiconductor memory, said current inverting means producing a first and second inverted electric current both precisely half but opposite in flow direction versus the reference current;
  (b) first trans-impedance means for receiving a difference of a first cell electric current from a first selected core memory cell indicative of its memory state, and said first inverted electric current from said current inverting means;
  (c) second trans-impedance means for receiving a difference of a second cell electric current from a second selected core memory cell indicative of its memory state, and said second inverted electric current from said current inverting means, each of said current inverting means, first and second trans-impedance means being effective for both pushing and pulling currents into and out of themselves; and
  (d) bias means for biasing said current inverting means and the first and second trans-impedance means, wherein said bias means is effective for providing a temperature compensated bias voltage to each of said current inverting and first and second trans-impedance means.

11. The sense amplifier circuit according to claim 10, further comprising first comparator means for receiving an output signal from said first trans-impedance means, said first comparator means being effective for producing cmos level output signals responsive to said first trans-impedance means.

12. The sense amplifier circuit according to claim 11, further comprising second comparator means for receiving an output signal from said second trans-impedance means, said second comparator means being effective for producing cmos level output signals responsive to said second trans-impedance means.

13. The sense amplifier circuit according to claim 10, further comprising first comparator means for receiving an output signal from said first trans-impedance means and for producing cmos level output signals responsive to said first trans-impedance means; and further comprising second comparator means for receiving an output signal from said second trans-impedance means and for producing cmos level output signals responsive to said second trans-impedance means.

14. The sense amplifier circuit according to claim 13, wherein each of said first and second comparator means comprises means for adjusting its voltage output swing range around a selected trip point.

15. The sense amplifier circuit according to claim 10, wherein said bias means comprises a native nmos enhancement transistor coupled between a power supply and a low temperature coefficient resistor connected to ground potential for producing a temperature independent current through the native nmos enhancement transistor and the low temperature coefficient resistor.

16. The sense amplifier circuit according to claim 15, wherein said bias means further comprises means for copying and multiplying said temperature independent current and producing pmos-compatible and nmos-compatible bias voltages.

17. A method of memory cell sense determination by combining sense and reference currents received respectively from a core memory cell in a semiconductor memory and from a reference cell in said semiconductor memory, comprising the steps of:
  (a) receiving said reference current from said reference cell in said semiconductor memory;
  (b) differencing a selected portion of said reference current with said sense current from the core memory cell in said semiconductor memory into a low impedance summation node to produce a differential current indicative of the state of said core memory cell; and
  (c) receiving said differential current with a trans-impedance circuit effective for producing an output signal responsive to said differential current and effective for sourcing and sinking said differential current depending on its direction of flow.

* * * * *